US012632635B1

(12) United States Patent
Kumar et al.

(10) Patent No.: US 12,632,635 B1
(45) Date of Patent: May 19, 2026

(54) SYSTEM AND METHOD FOR DISPLAYING A SIGNAL FLOW DIAGRAM

(71) Applicant: Cadence Design Systems, Inc., San Jose, CA (US)

(72) Inventors: Hitesh Mohan Kumar, Greater Noida (IN); Taranjit Singh Kukal, Delhi (IN); Surender Singh, New Delhi (IN)

(73) Assignee: Cadence Design Systems, Inc., San Jose, CA (US)

( * ) Notice: Subject to any disclaimer, the term of this patent is extended or adjusted under 35 U.S.C. 154(b) by 865 days.

(21) Appl. No.: 17/740,459

(22) Filed: May 10, 2022

(51) Int. Cl.
G06F 30/30 (2020.01)
G06F 30/392 (2020.01)

(52) U.S. Cl.
CPC ................................. G06F 30/392 (2020.01)

(58) Field of Classification Search
CPC ...................................................... G06F 30/392
See application file for complete search history.

(56) References Cited

U.S. PATENT DOCUMENTS

| | | | | |
|---|---|---|---|---|
| 10,585,997 | B1 * | 3/2020 | Ulusoy | G06F 30/31 |
| 2005/0080833 | A1 * | 4/2005 | Smith | G06F 17/142 |
| | | | | 708/404 |
| 2013/0031509 | A1 * | 1/2013 | Curtis | G06F 30/394 |
| | | | | 715/810 |

* cited by examiner

*Primary Examiner* — Jack Chiang
*Assistant Examiner* — Brandon Bowers
(74) *Attorney, Agent, or Firm* — Mark H. Whittenberger; Holland & Knight LLP

(57) ABSTRACT

The present disclosure relates to a method for use with an electronic design. Embodiments may include receiving, using a processor, an electronic design and applying one or more predefined rules to the electronic design. Embodiments may further include automatically generating a connectivity aware system signal flow diagram and causing a display of the connectivity aware system signal flow diagram at a graphical user interface.

21 Claims, 18 Drawing Sheets

10 receiving, using a processor, an electronic design

202 applying one or more predefined rules to the electronic design

204 generating a connectivity aware system signal flow diagram

206 causing a display of the connectivity aware system signal flow diagram at a graphical user interface

208

300

Multiple inputs on a device

Multiple outputs on a device

600

Grouping of signals using a merge node

Splitting of signals using a split node

Thick trunk for group of signals (expandable and collapsible)

Thin trunk for group of signals (expandable and collapsible)

800

900

Output Signals Grouping Rule

Signals Split Rule

Device Split Rule

Signals Merge Rule

Output Signals Grouping Rule

Device Grouping Rule For input pins

Post Analysis Result
Visualization

SYSTEM AND METHOD FOR DISPLAYING A SIGNAL FLOW DIAGRAM

FIELD OF THE INVENTION

The embodiments of the present disclosure relate to a method of electronic circuit design, and more particularly, to a method for displaying a signal flow diagram in an electronic circuit design.

BACKGROUND

Electronic design automation (EDA) tools exist currently and allow circuit designers to make changes to a given circuit design at a graphical user interface (GUI). System signal flow diagrams for critical signals (e.g., power, clock etc.) are an integral part of the electronic design process. Such diagrams are often dense and complex as designers need a consolidated diagram for multiple signals together. Such a diagram provides the complete power system in one view. These diagrams must be complete, yet simple and easily understood. Existing approaches are not capable of automatically generating such diagrams satisfying these key attributes together.

SUMMARY

Accordingly, an embodiment of the present disclosure is directed to a computer-implemented method for use with an electronic design. The method may include receiving, using a processor, an electronic design and applying one or more predefined rules to the electronic design. The method may further include generating a connectivity aware system signal flow diagram and causing a display of the connectivity aware system signal flow diagram at a graphical user interface.

One or more of the following features may be included. In some embodiments, the electronic design may be an electronic design schematic, an electronic design layout or other aspect of an electronic design. The one or more predefined rules may include, but are not limited to, an output signals grouping rule, a signals split rule, a signals merge rule, a device grouping rule for input pins, and/or a device split rule. The display may be an expandable and collapsible tree structure. The expandable tree structure may include all source to sink signals placed and connected in order.

In another embodiment of the present disclosure a computer-readable storage medium having stored thereon instructions, which when executed by a processor result in a number of operations is provided. Operations may include receiving, using a processor, an electronic design and applying one or more predefined rules to the electronic design. Operations may further include automatically generating a connectivity aware system signal flow diagram and causing a display of the connectivity aware system signal flow diagram at a graphical user interface.

One or more of the following features may be included. In some embodiments, the electronic design may be an electronic design schematic, an electronic design layout or other aspect of an electronic design. The one or more predefined rules may include, but are not limited to, an output signals grouping rule, a signals split rule, a signals merge rule, a device grouping rule for input pins, and/or a device split rule. The display may be an expandable and collapsible tree structure. The expandable tree structure may include all source to sink signals placed and connected in order.

It is to be understood that both the foregoing general description and the following detailed description are exemplary and explanatory and are intended to provide further explanation of embodiments of the present disclosure as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Figure 1:
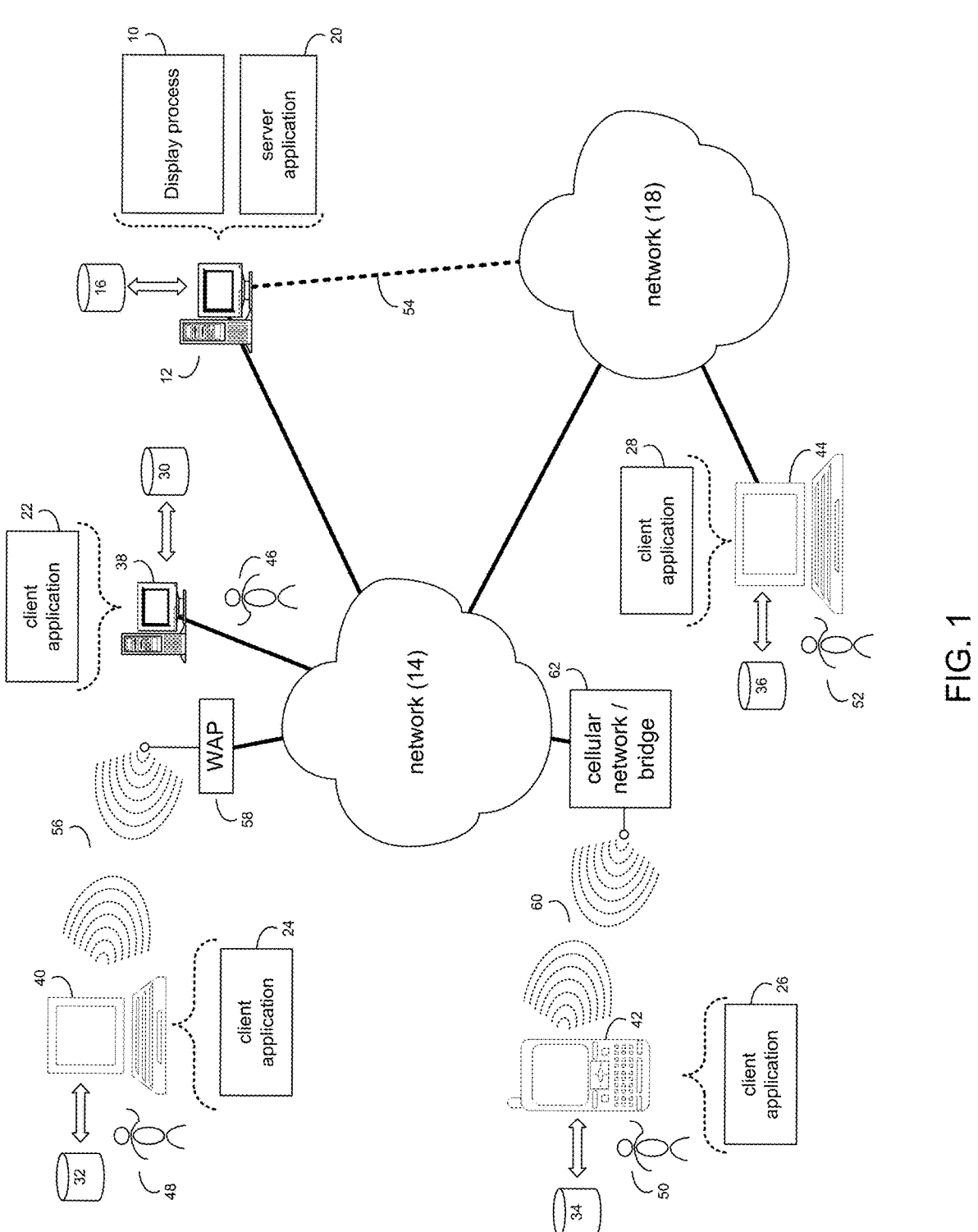
FIG. 1 diagrammatically depicts a display process coupled to a distributed computing network.

Embodiments included herein are directed towards a system and method for automatically generating a system signal flow diagram in an electronic design. Existing solutions provide a very detailed and expanded view of such diagrams, which is extremely cumbersome and difficult for an electronic designer to review. The diagrams essentially show objects connected through wires. In the absence of intelligent placement of objects (e.g., rectangular boxes) and smart sequencing of wiring, the diagrams show-up as a web of connections. Moreover, existing solutions visualize signals individually but do not extend well for architecture diagrams depicting interface signals. Embodiments included herein describe a display process that may be configured to address these issues.

Reference will now be made in detail to the embodiments of the present disclosure, examples of which are illustrated in the accompanying drawings. The present disclosure may, however, be embodied in many different forms and should not be construed as being limited to the embodiments set forth herein; rather, these embodiments are provided so that this disclosure will be thorough and complete, and will fully convey the concept of the present disclosure to those skilled in the art. In the drawings, the thicknesses of layers and regions may be exaggerated for clarity. Like reference numerals in the drawings denote like elements.

Referring to FIG. 1, there is shown display process 10 that may reside on and may be executed by server computer 12, which may be connected to network 14 (e.g., the internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft Windows XP Server™; Novell Netware™, or Redhat Linux™, for example. Additionally and/or alternatively, the display process may reside on a client electronic device, such as a personal computer, notebook computer, personal digital The instruction sets and subroutines of display process 10, which may be stored on storage device 16 coupled to server computer 12, may be executed by one or more processors (not shown) and one or more memory architectures (not shown) incorporated into server computer 12. Storage device 16 may include but is not limited to: a hard disk drive; a tape drive; an optical drive; a RAID array; a random access memory (RAM); and a read-only memory (ROM).

Server computer 12 may execute a web server application, examples of which may include but are not limited to: Microsoft IIS™, Novell Webserver™, or Apache Webserver™, that allows for HTTP (i.e., HyperText Transfer Protocol) access to server computer 12 via network 14. Network 14 may be connected to one or more secondary networks (e.g., network 18), examples of which may include but are not limited to: a local area network; a wide area network; or an intranet, for example.

Server computer 12 may execute one or more server applications (e.g., server application 20), examples of which may include but are not limited to, e.g., Lotus Domino™ Server and Microsoft Exchange™ Server. Server application 20 may interact with one or more client applications (e.g., client applications 22, 24, 26, 28) in order to execute display process 10. Examples of client applications 22, 24, 26, 28 may include, but are not limited to, design verification tools such as those available from the assignee of the present disclosure. These applications may also be executed by server computer 12. In some embodiments, display process 10 may be a stand-alone application that interfaces with server application 20 or may be an applet/application that is executed within server application 20.

The instruction sets and subroutines of server application 20, which may be stored on storage device 16 coupled to server computer 12, may be executed by one or more processors (not shown) and one or more memory architectures (not shown) incorporated into server computer 12.

As mentioned above, in addition/as an alternative to being a server-based application residing on server computer 12, the display process may be a client-side application (not shown) residing on one or more client electronic devices 38, 40, 42, 44 (e.g., stored on storage devices 30, 32, 34, 36, respectively). As such, the display process may be a stand-alone application that interfaces with a client application (e.g., client applications 22, 24, 26, 28), or may be an applet/application that is executed within a client application. As such, the display process may be a client-side process, a server-side process, or a hybrid client-side/server-side process, which may be executed, in whole or in part, by server computer 12, or one or more of client electronic devices 38, 40, 42, 44.

The instruction sets and subroutines of client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory architectures (not shown) incorporated into client electronic devices 38, 40, 42, 44 (respectively). Storage devices 30, 32, 34, 36 may include but are not limited to: hard disk drives; tape drives; optical drives; RAID arrays; random access memories (RAM); read-only memories (ROM), compact flash (CF) storage devices, secure digital (SD) storage devices, and memory stick storage devices. Examples of client electronic devices 38, 40, 42, 44 may include, but are not limited to, personal computer 38, laptop computer 40, personal digital assistant 42, notebook computer 44, a data-enabled, cellular telephone (not shown), and a dedicated network device (not shown), for example. Using client applications 22, 24, 26, 28, users 46, 48, 50, 52 may utilize formal analysis, testbench simulation, and/or hybrid technology features verify a particular integrated circuit design.

Users 46, 48, 50, 52 may access server application 20 directly through the device on which the client application (e.g., client applications 22, 24, 26, 28) is executed, namely client electronic devices 38, 40, 42, 44, for example. Users 46, 48, 50, 52 may access server application 20 directly through network 14 or through secondary network 18. Further, server computer 12 (e.g., the computer that executes server application 20) may be connected to network 14 through secondary network 18, as illustrated with phantom link line 54.

In some embodiments, display process 10 may be a cloud-based process as any or all of the operations described herein may occur, in whole, or in part, in the cloud or as part of a cloud-based system. The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 56 established between laptop computer 40 and wireless access point (i.e., WAP) 58, which is shown directly coupled to network 14. WAP 58 may be, for example, an IEEE 802.11a, 802.11b, 802.11g, Wi-Fi, and/or Bluetooth device that is capable of establishing wireless communication channel 56 between laptop computer 40 and WAP 58. Personal digital assistant 42 is shown wirelessly coupled to network 14 via wireless communication channel 60 established between personal digital assistant 42 and cellular network/bridge 62, which is shown directly coupled to network 14.

As is known in the art, all of the IEEE 802.11x specifications may use Ethernet protocol and carrier sense multiple access with collision avoidance (CSMA/CA) for path sharing. The various 802.11x specifications may use phase-shift keying (PSK) modulation or complementary code keying (CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows™, Microsoft Windows CE™, Redhat Linux™, Apple IOS, ANDROID, or a custom operating system.

Figure 2:
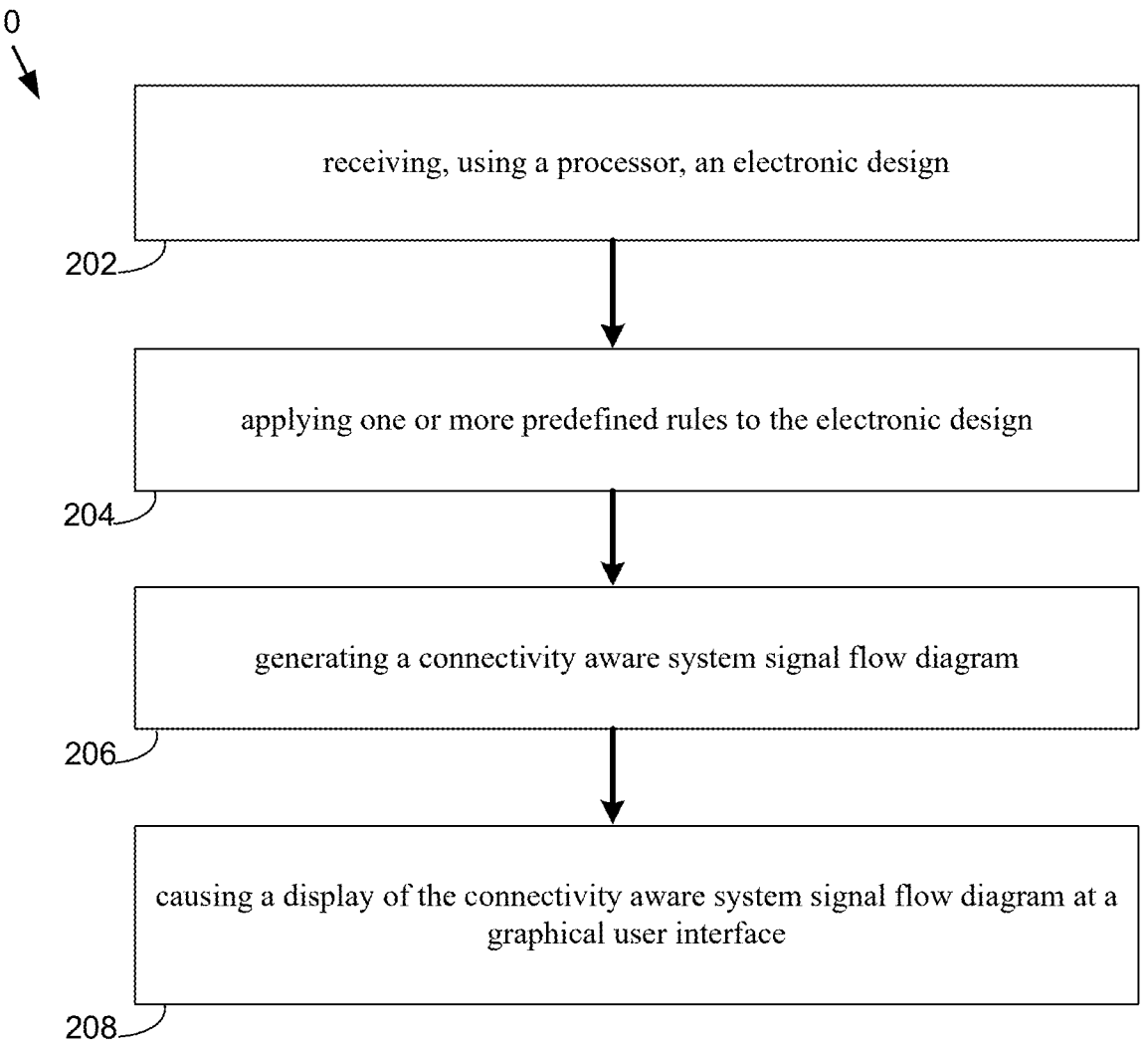
FIG. 2 is an exemplary flowchart of a display process according to an embodiment of the present disclosure.

Referring now to FIG. 2, a flowchart depicting an embodiment consistent with display process 10 is provided. The method may include receiving (202), using a processor, an electronic design and applying (204) one or more predefined rules to the electronic design. The method may further include generating (206) a connectivity aware system signal flow diagram and causing (208) a display of the connectivity aware system signal flow diagram at a graphical user interface. Numerous other operations are also within the scope of the present disclosure as discussed hereinbelow.

Embodiments of display process 10 provide a system and method to automatically generate and visualize system signal flow diagrams. Accordingly, embodiments included herein may allow for the intelligent placement of blocks to optimize space on a graphical user interface. Display process 10 allows for the grouping of objects to simplify comprehension and minimize clutter. Display process 10 may also allow for the grouping of signals and sequenced/tapping of connections to ensure comprehensible signal-flow. Display process 10 may be configured to retain the actual connectivity that may be used to feed simulations (e.g. SPICE) for analysis. In some embodiments, a strict tree structure may be used and the methodology may be used to support architecture diagram/interfaces. Each of these concepts is discussed in further detail hereinbelow.

Figure 3:
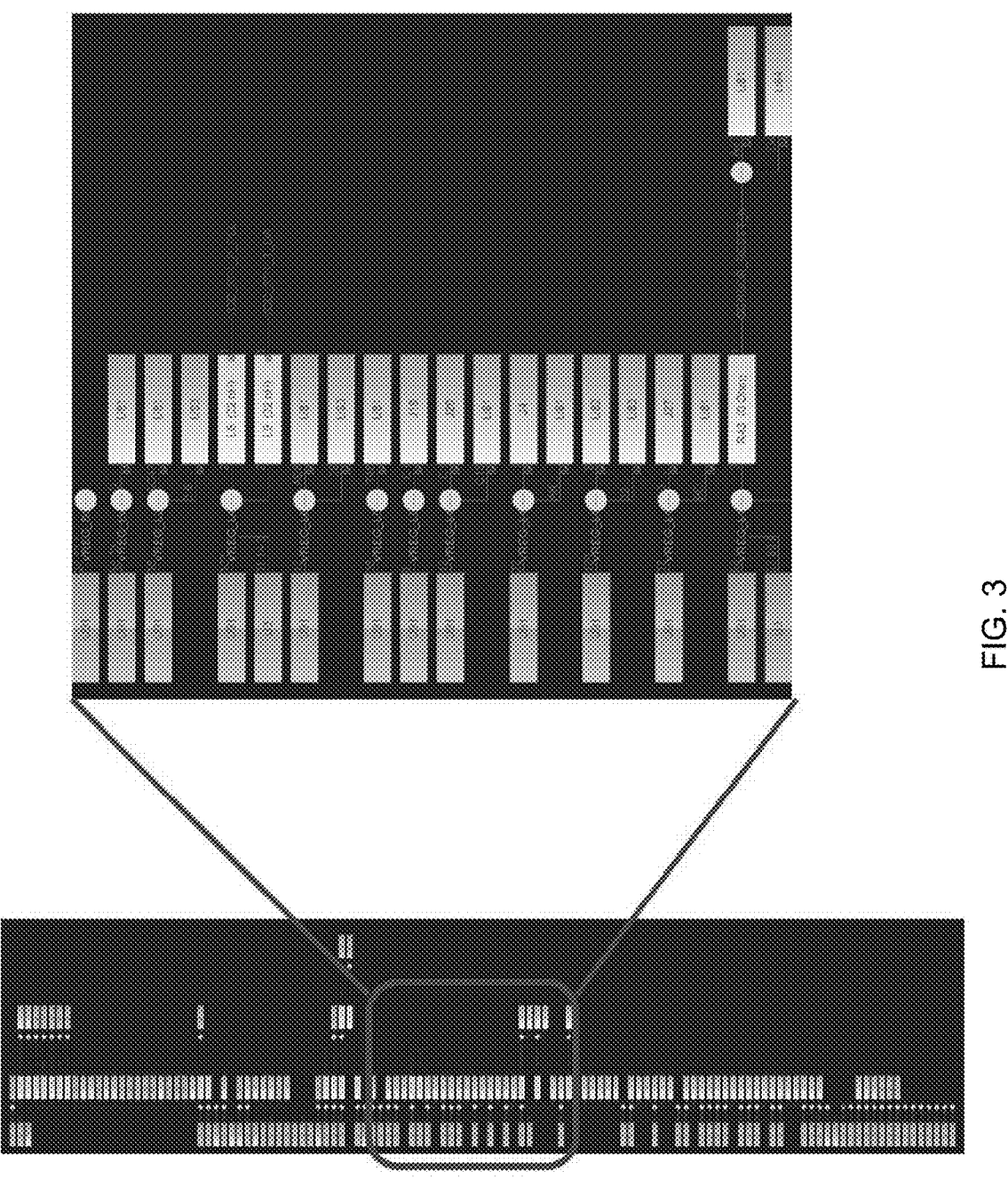
FIGS. 3-17 show various examples of graphical user interfaces showing illustrations of a display process according to embodiments of the present disclosure.

Referring now to FIG. 3, an embodiment showing an example graphical user interface 300 consistent with existing solutions is provided. This particular diagram is an example of displaying and analyzing power systems/rails from source pins to sink pins. This type of display provides a detailed tree view but it is often difficult to visualize and analyze due to the high density and sparsity of the display. Due to various limitations such as one input-output supported per node, the same device may be split into multiple objects to show individual pin-power net connections. This causes a significant increase in the amount of space required. Additionally and/or alternatively, this type of display doesn't adequately group power nets for routing and displaying connections, which leads to the use of extra space. To address the above issues, designers manually create power system/rails diagrams, however, they may then lose associations and automatic updates from its complete circuit schematic.

Figure 4:
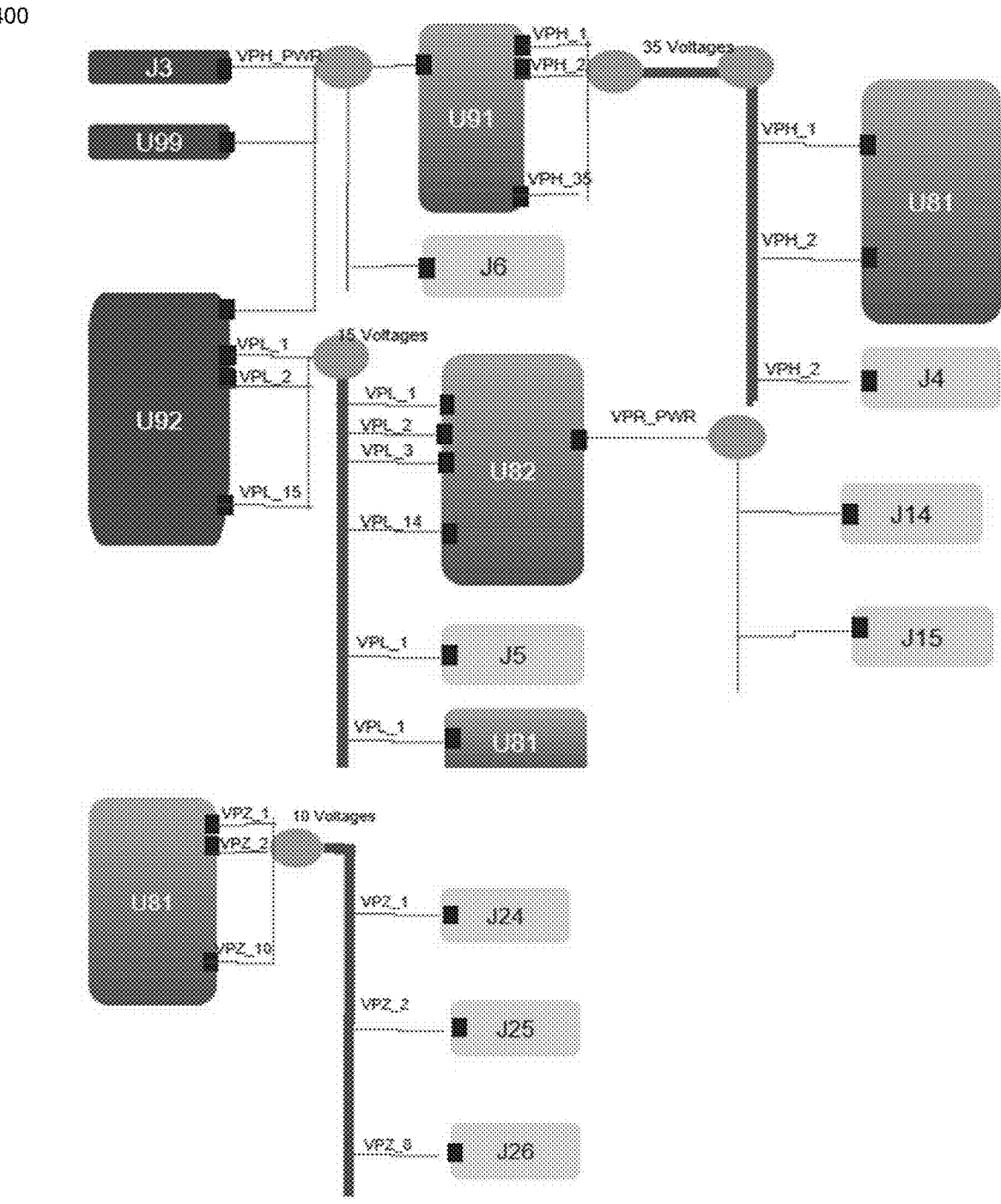

Referring now to FIG. 4, an embodiment showing an example graphical user interface 400 consistent with display process 10 is provided. As used herein, the term "source" may refer to a device that supplies voltage and current (e.g., battery), a "sink" may refer to a device that consumes power provided by power source (e.g., VCC pin of the integrated circuit), and a "voltage regulator may refer to a device that converts one power source into multiple/different power sources (e.g., DC-DC converters). In the particular example of FIGS. 4, J3, U99 and U92 are power source devices wherein J3 and U99 are single power source devices that supply single power (VPH_PWR). U92 is a power source device supplying multiple powers (e.g., VPH_PWR, VPL_1, VPL2, etc. up to VPL_15). U91, U81 and U82 are voltage regulator module devices, which act as both a power sink and power source. U91 is a power device which has one power (e.g., VPH_PWR) coming into it and it is supplying multiple powers (e.g., VPH_1, VPH_2, etc. up to VPH_35). This device is a single input-multiple output power device, hence it is displayed as a single device. U82 is power device which has multiple power inputs (e.g., VPL1, VPL_2, VPL_3, etc. up to VPL_14) belonging to same power source (same power group) and has one output power supply (VPR_PWR). This device may also be modeled and displayed as a single device. U81 is a power device which has multiple power inputs (e.g., VPH_1, VPH_2 and VPL_1) belonging to different power sources with VPH_1 and VPH_2 belonging to one power source (U91) and VPL_1 belonging to another power source (U92) and it also supplies multiple power outputs (VPZ_1, VPZ_2, etc. up to VPZ_10). This device is modeled and multiple split devices (3) showing different power source inputs and outputs. The devices (J4, J5, J6, J14, J15, J24, J25 and J26) are sink devices which consume power. They are modeled and displayed as single device each.

Embodiments included herein may provide a system signal flow diagram that may group the pins and signals based on certain rules (as described in FIGS. 5-7) to generate and visualize the dense diagram far more cleanly, and in a smaller space, without losing any of the designer's intent. In this way, display process 10 may be used to create a simple and comprehensible, complete (no loss of any data or designer intent), tree structure, space optimized, display that clearly depicts grouped signals and connections. The strict tree structure generated by display process 10 helps the designer to expand and/or collapse nodes of interest on demand. The failure paths may be clearly visualized and analyzed using this diagram. Embodiments of display process 10 may extend well for architecture diagrams depicting interface signals and/or a set of signals.

Figure 5:
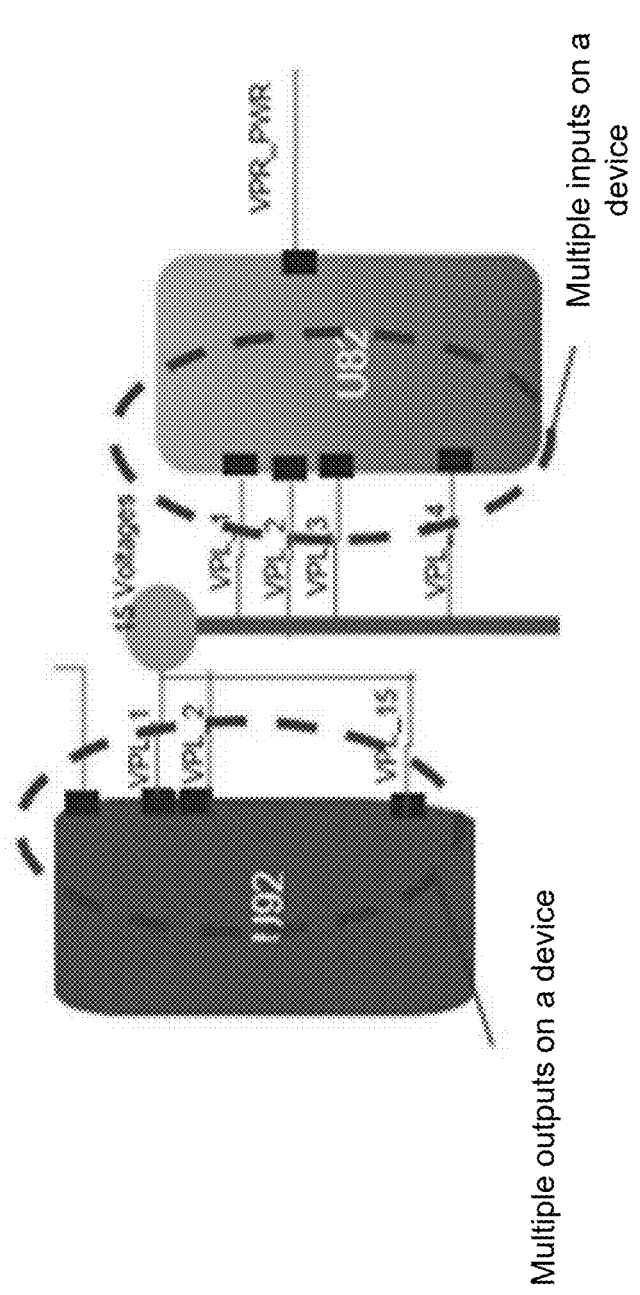
Figure 6:
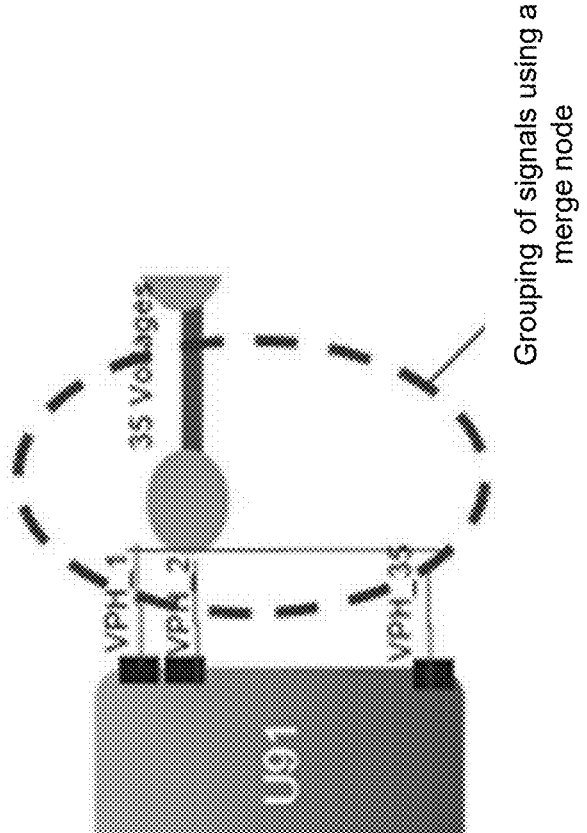
Figure 7:
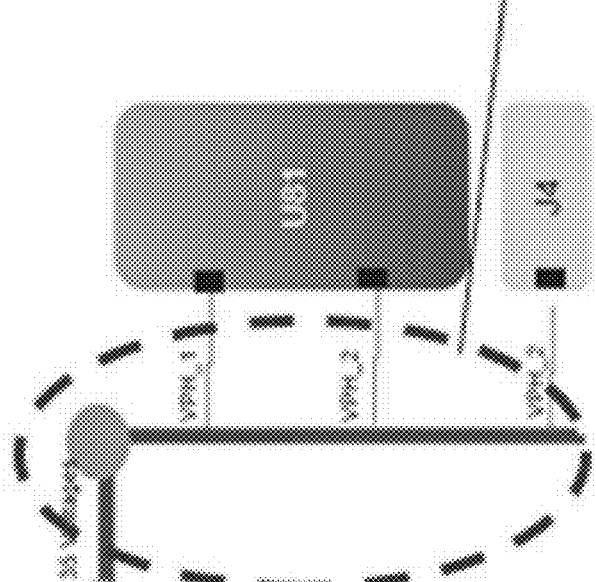

Referring now to FIGS. 5-7, embodiments of graphical user interfaces 500, 600, 700 showing example display rules consistent with display process 10 are provided. As discussed above, display process 10 may be configured to automatically parse a schematic or layout to generate the various displays discussed herein. In operation, display process 10 may utilize an extraction function that may traverse the power rail(s) in the circuit and generate a signal connectivity graph including all source, voltage regulator and sink devices in the power rail. The connectivity graph parser and modeler parses and generates the expanded signal flow model after identifying one or more of the following: devices to be split as per the device split rule, signals to be grouped as per the signal merge rule and signal groups to be split as per the signal split rule. The expanded signal flow model may be displayed to the end user.

In some embodiments, devices may include multiple input and output pins as shown in FIG. 5. Each pin denotes one connection point connected to one signal on the device. In some embodiments, a group of output signals may be created using a merge node as shown in FIG. 6. Split nodes may be inserted to display the splitting of signals from a group as shown in FIG. 7.

Figure 8:
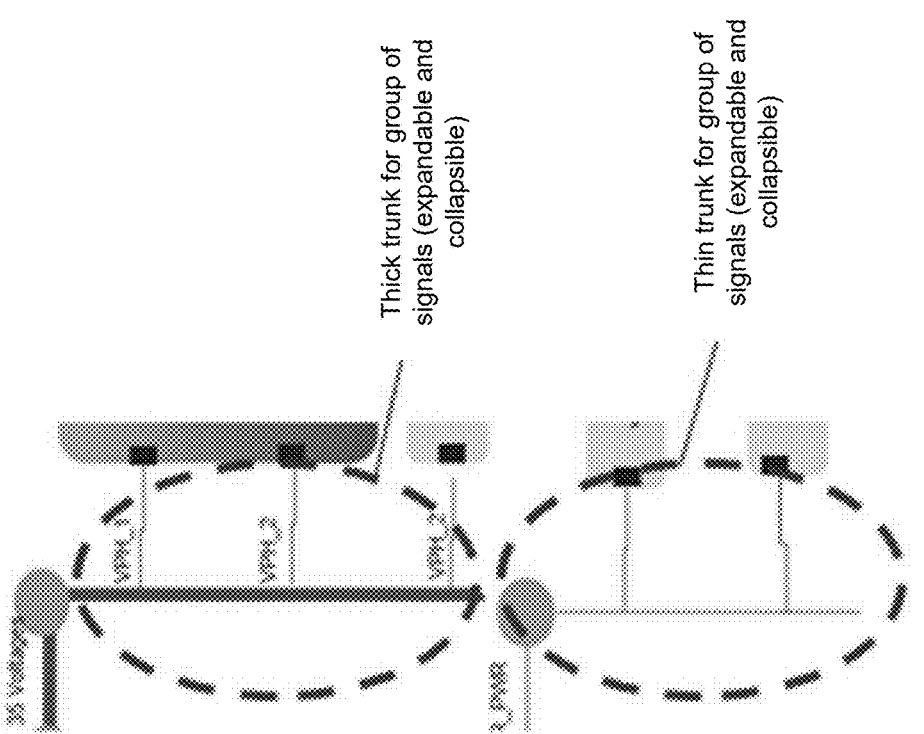

Referring now to FIG. 8, an embodiment of display process 10 including a graphical user interface 800 showing signal net display attributes is provided. In some embodiments, a thick display trunk may be used for a group of signals. In contrast, a thinner display trunk may be used for a single signal. Display process 10 may allow for the merging and/or splitting of junctions at every point of merger or split. In some embodiments, junctions may be collapsible. On collapse, all down the line circuit may become hidden.

Figure 9:
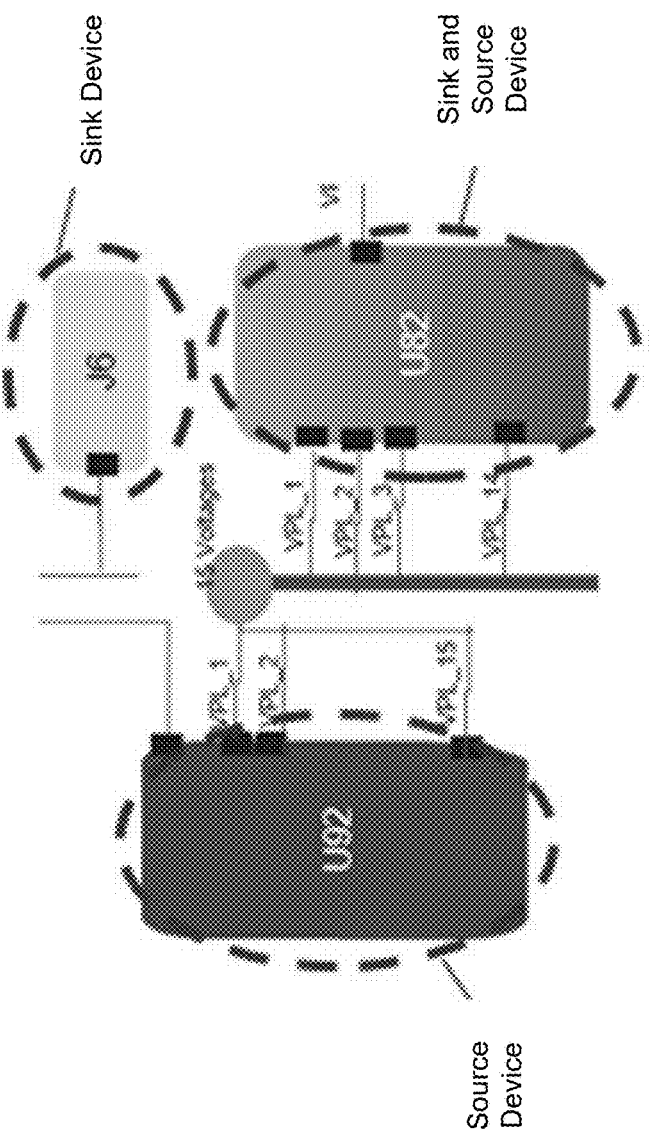

Referring now to FIG. 9, an embodiment of display process 10 including a graphical user interface 900 showing signal net display attributes is provided. In some embodiments, devices may be displayed differently based upon the type of device with respect to the input/output signal(s). For example, source devices, sink devices and both source and sink devices.

Figure 10:
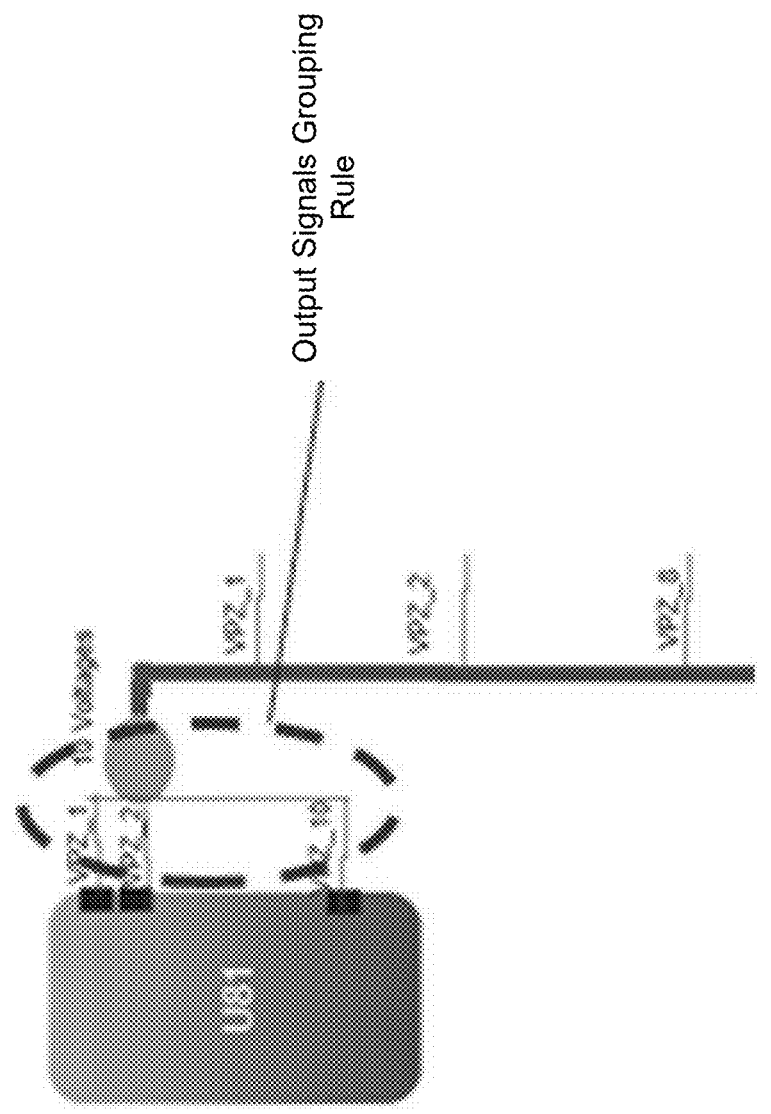

Referring now to FIG. 10, an embodiment of display process 10 including a graphical user interface 1000 showing an output signals grouping rule is provided. In some embodiments, display process 10 may be configured to group all signals originating from a single source device.

Figure 11:
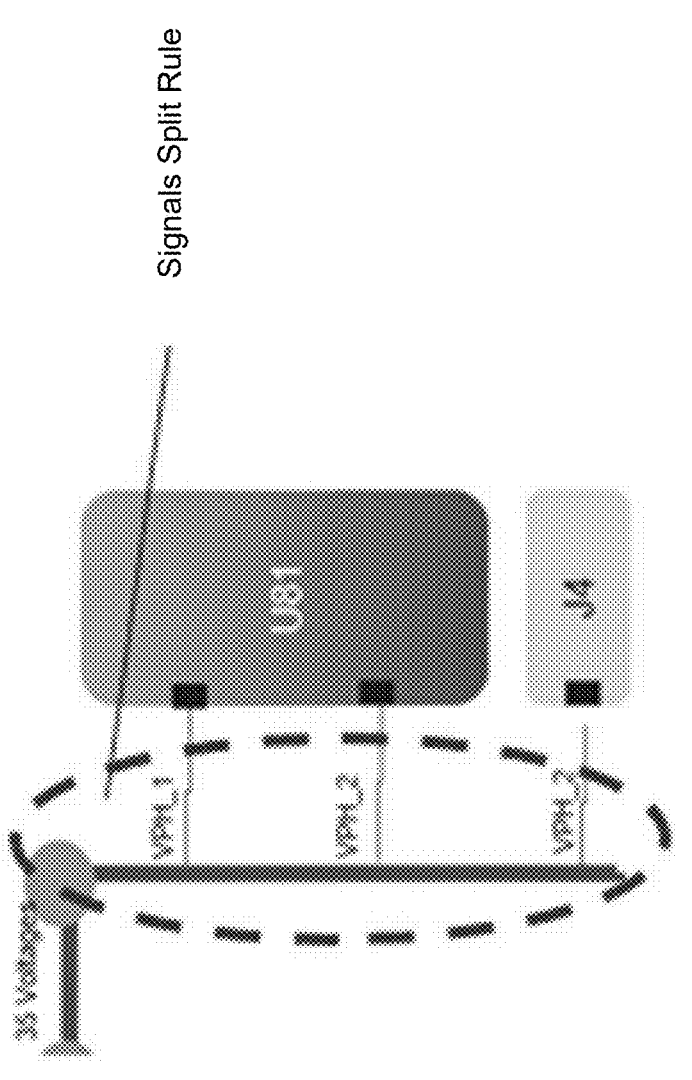

Referring now to FIG. 11, an embodiment of display process 10 including a graphical user interface 1100 showing a signals split rule is provided. In some embodiments, display process 10 may be configured to allow for one or more grouped signals to travel as one entity until they need to be split again using the split node for making individual connections.

Figure 12:
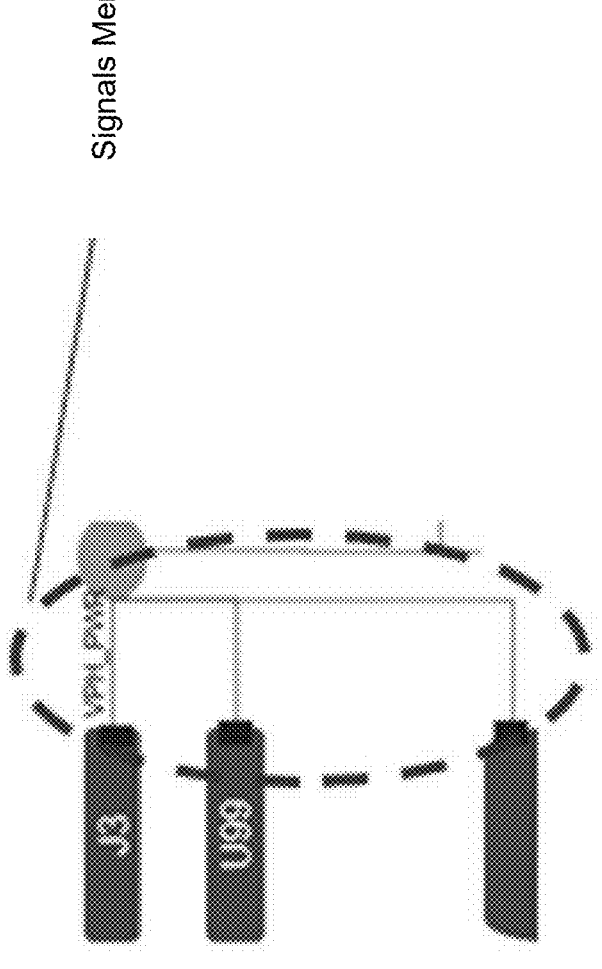

Referring now to FIG. 12, an embodiment of display process 10 including a graphical user interface 1200 showing a signals merge rule is provided. In some embodiments, display process 10 may be configured to allow for common signals driven from multiple sources to be associated together using a merge node.

Figure 13:
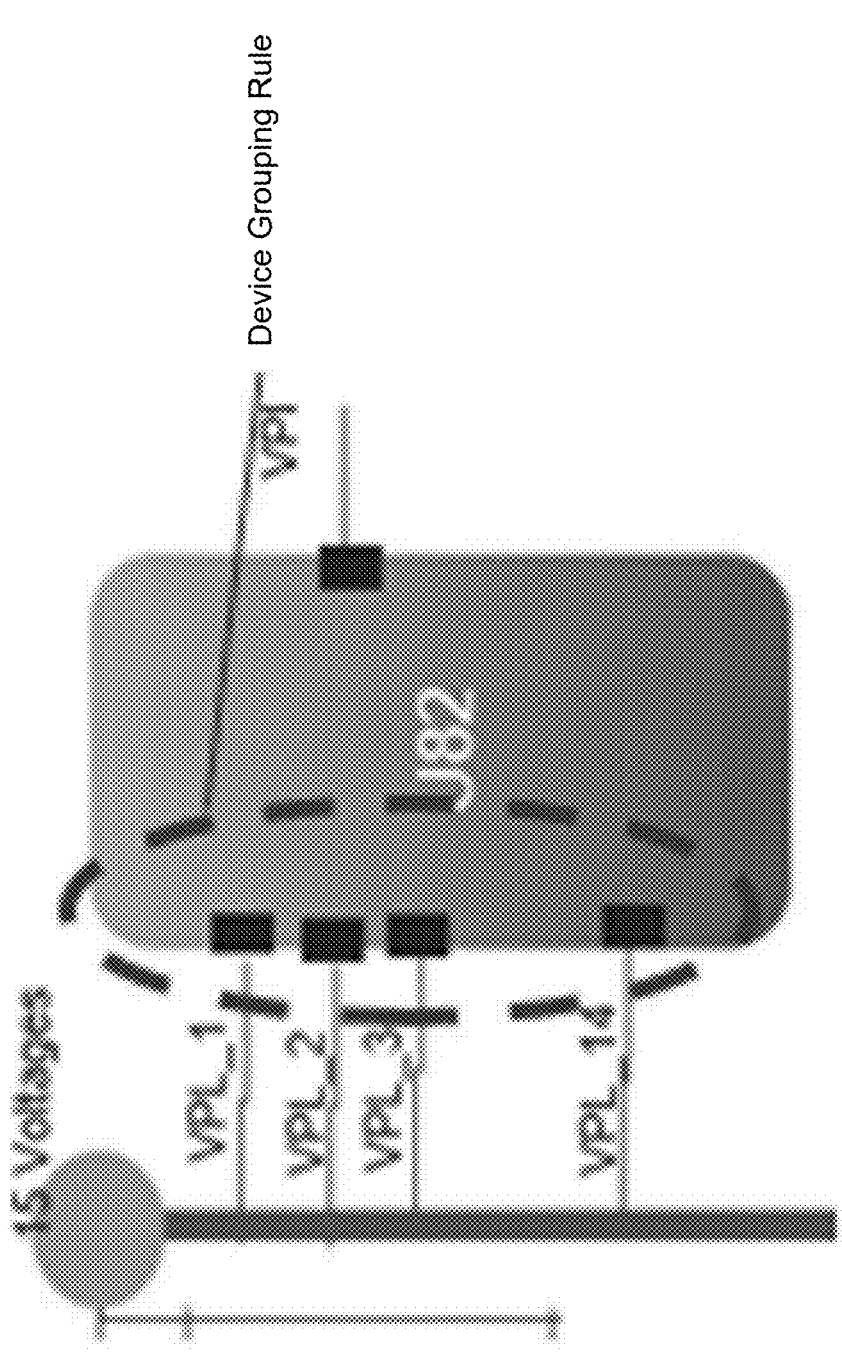

Referring now to FIG. 13, an embodiment of display process 10 including a graphical user interface 1300 showing device grouping rules for input pins is provided. In some embodiments, display process 10 may be configured to display those input pins on one device which may be connected to the signals belonging to same signal group.

Figure 14:
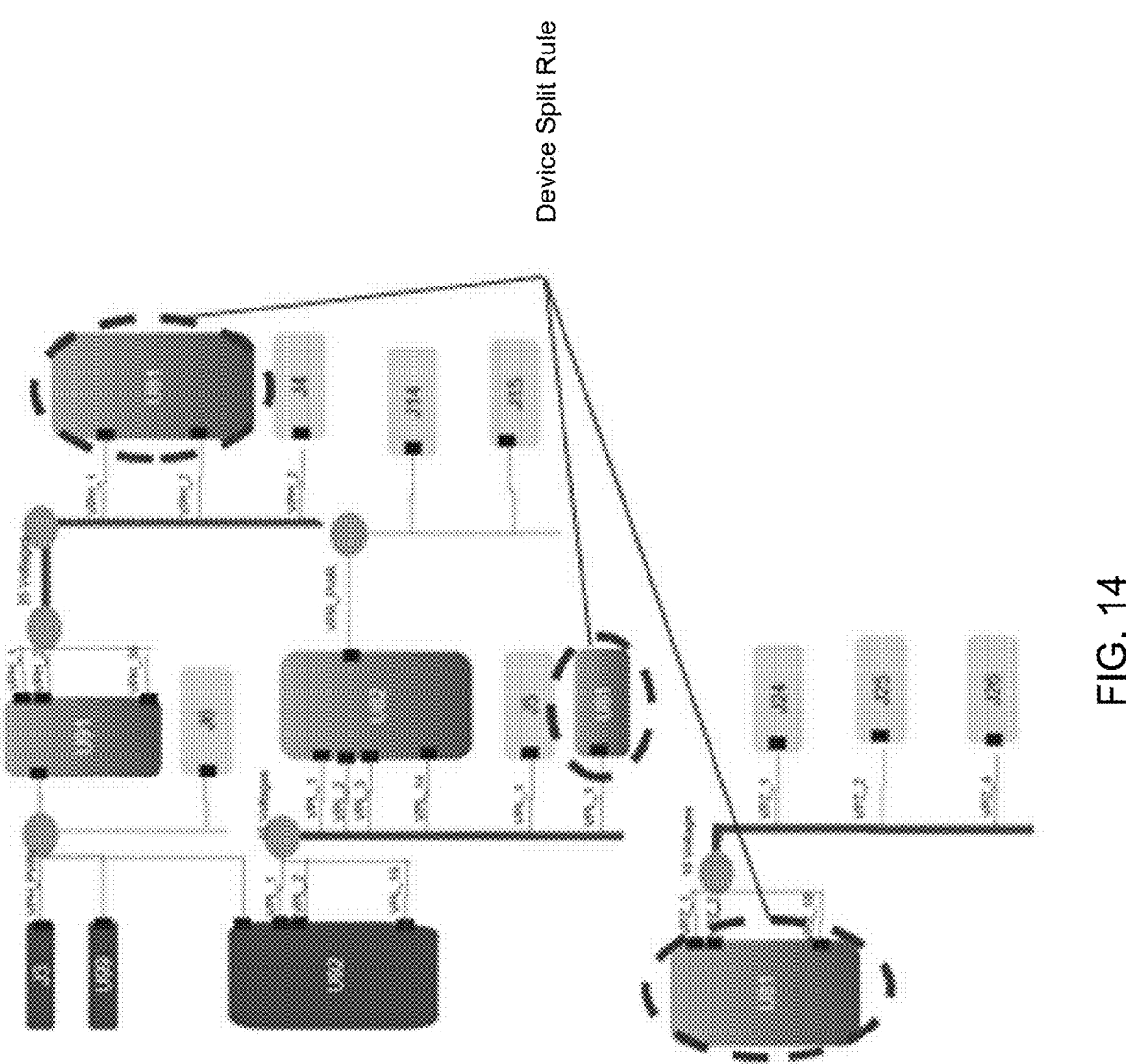

Referring now to FIG. 14, an embodiment of display process 10 including a graphical user interface 1400 showing an example device split rule is provided. In some embodiments, display process 10 may be configured to allow a device to be split into multiple sub-devices when the source of signals is different. For example, one sub-device per signal group or per signal (e.g., when a signal is standalone and not part of any group). When a device is split into multiple sub-devices due to input source differences, it may have a separate output sub-device. This rule is necessary to ensure that a tree structure is always maintained. In this particular example, a device "U81" may be split into multiple sub-devices when the source of input signals is different.

Figure 15:
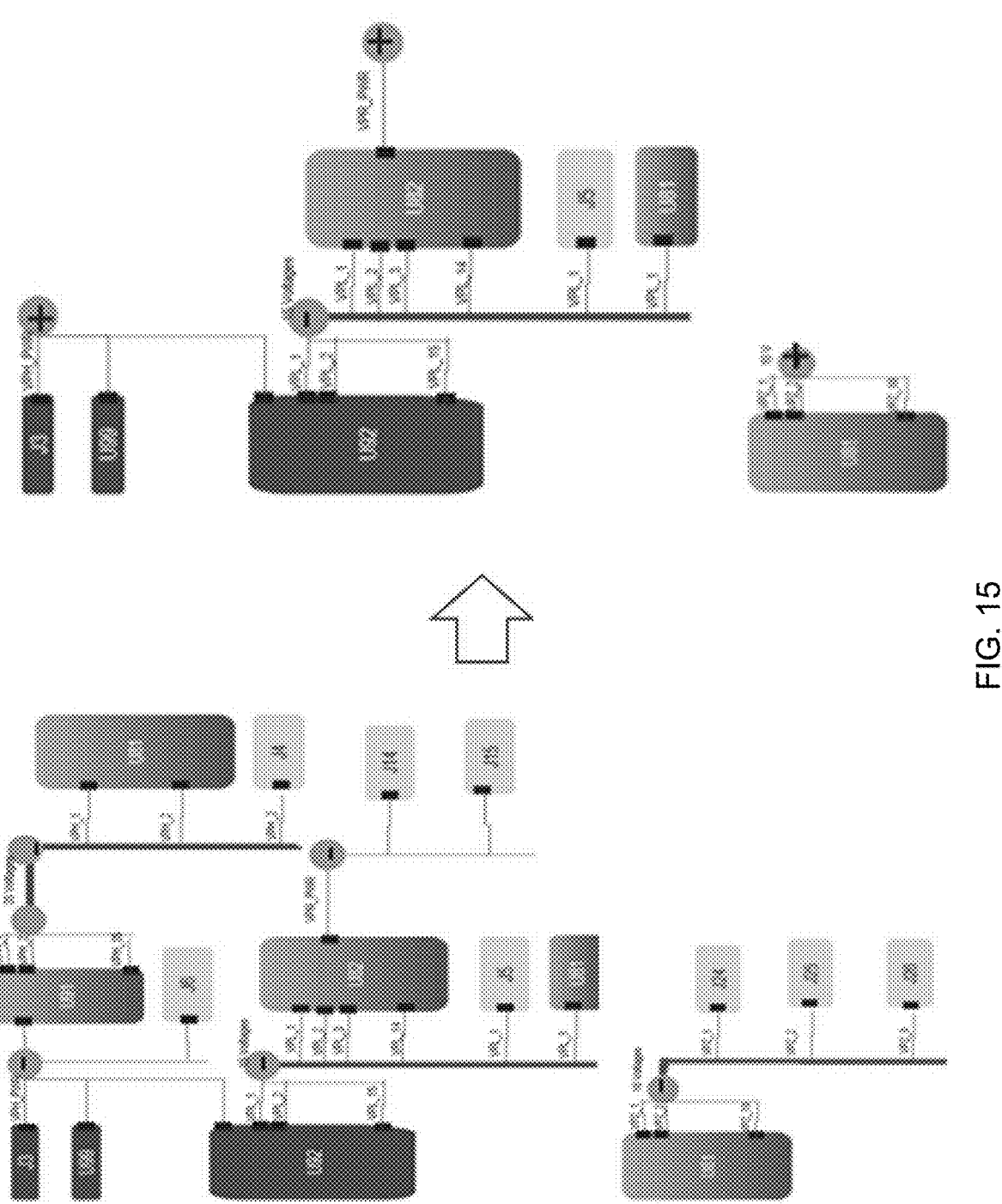

Referring now to FIG. 15, an embodiment of display process 10 including a graphical user interface 1500 showing an example placement rule is provided. In some embodiments, display process 10 may include a placement rule that provides for strict tree creation. The left most portion of FIG. 15 shows an expanded tree view wherein all source to sink connections are placed and connected in order. A partially collapsed tree view wherein only desired nodes are visible is provided in the right portion of FIG. 15.

In operation, display process 10 may configured to place and connect the source to sink in order. The process may also be configured to connect the devices using the output signals grouping rule, signals split and/or merge rule described above. In some embodiments, display process 10 may be configured to split the device into multiple sub-devices, whenever required to maintain a strict tree structure, in accordance with the device split rule. The signal groups may be split into one or more sub-groups to address any spacing limitations. The strict tree structure ensures that every signal flow may be collapsed or expanded on demand.

Figure 16:
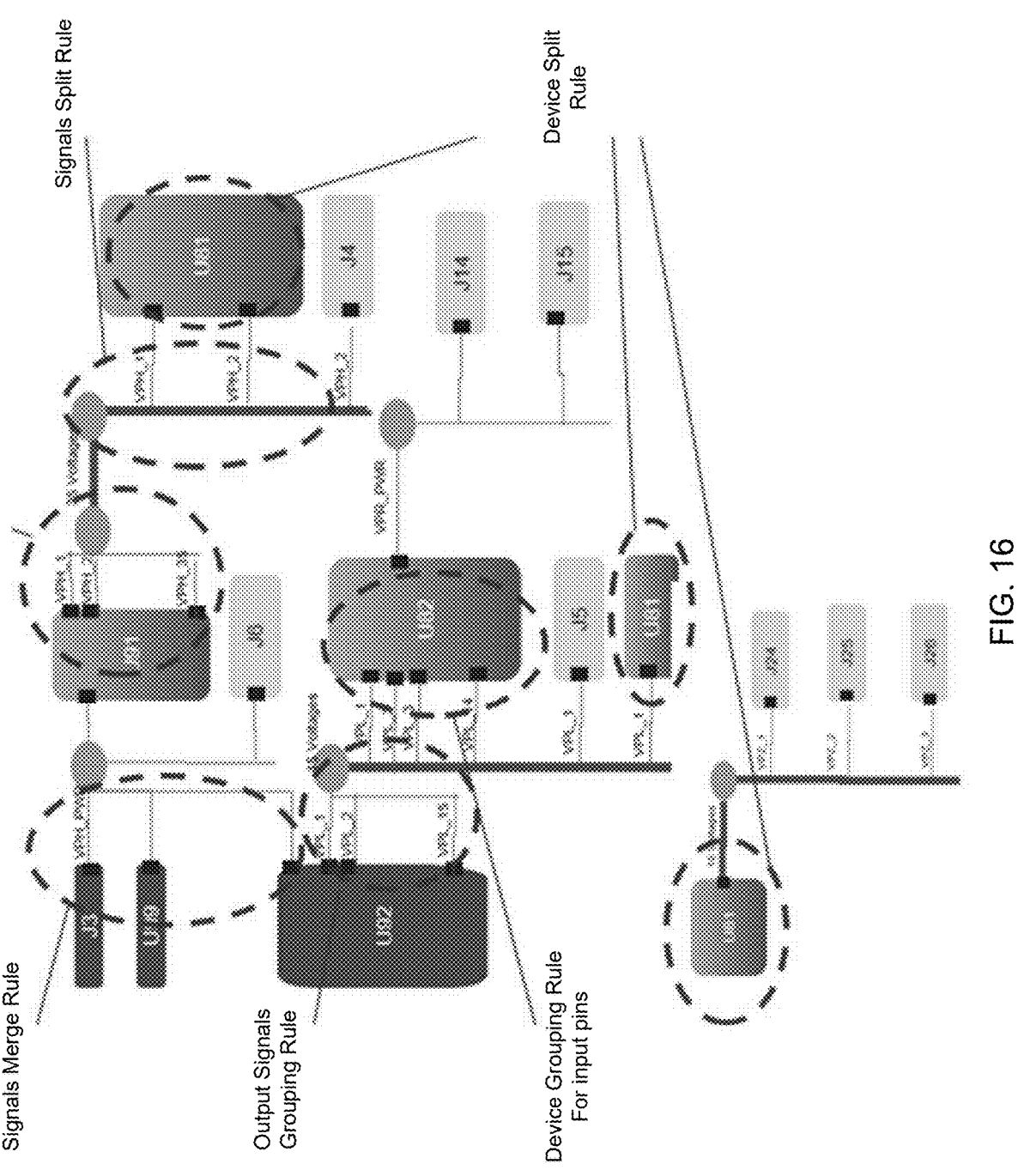

Referring now to FIG. 16, an embodiment of display process 10 including a graphical user interface 1600 showing an example consolidated view is provided. In some embodiments, display process 10 may include the signals merge rule (wherein common signals driven from multiple sources are associated together using a merge node), an output signals grouping rule (wherein the process groups all signals originating from single source (device)), a device grouping rule for input pins (wherein the process may group all input pins in one device when these pins are connected with the signals belonging to same group), an output signals grouping rule (wherein the process may group all signals originating from single source (device)), a signals split rule (wherein grouped signals may travel as one entity until they need to be split again using the split node for making individual connections), and/or a device split rule (wherein a device may be split into multiple sub-devices when the source of signals is different. One sub-device per signal group or per signal (when a signal is a standalone and not part of any group)). When a device is split into multiple sub-devices due to input source differences, it will have a separate output sub-device.

Figure 17:
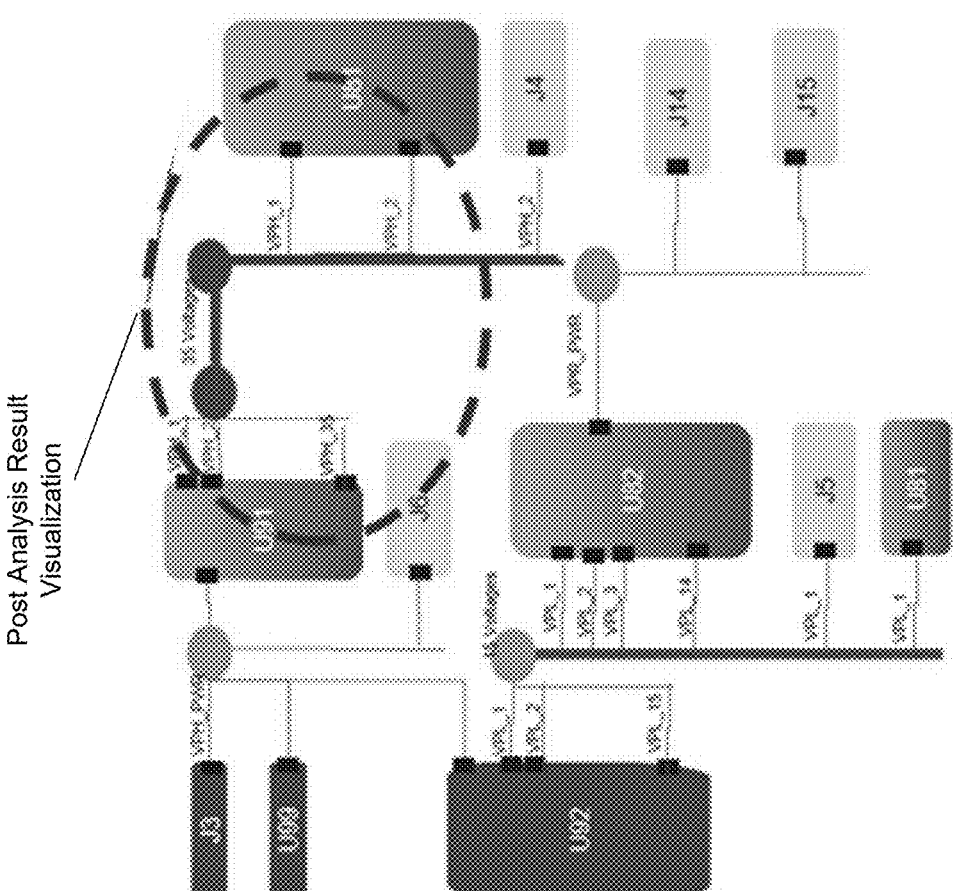
Figure 17:
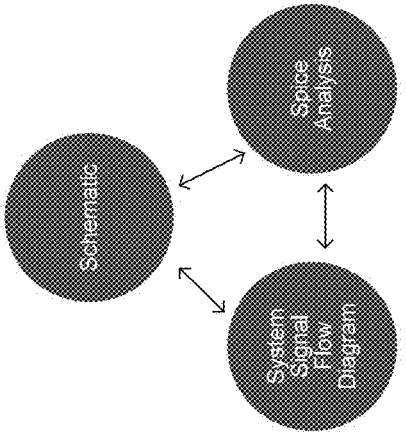

Referring now to FIG. 17, an embodiment of display process 10 including a graphical user interface 1700 showing an example for SPICE analysis is provided. In some embodiments, display process 10 may allow for electrical connectivity for SPICE analysis and post-analysis visualization. In operation, a schematic design may be created and the process may be used to run extraction to automatically generate the connectivity-aware system signal flow diagram. This may be performed for one or multiple signals and/or interfaces, for part of or complete circuit for desired signal (s), etc. The process may allow for cross-probing at any time between the schematic and signal flow diagram in either direction. The process may also assign electrical analysis models and parameters, run the analysis, and then back-annotate results. Accordingly, display process 10 may allow for the visualization in a system signal flow diagram viewer/ editor for all failure paths and violations. It should be noted that while examples included herein reference SPICE, this is provided merely by way of example as display process 10 may be used in association with any simulator.

Figure 18:
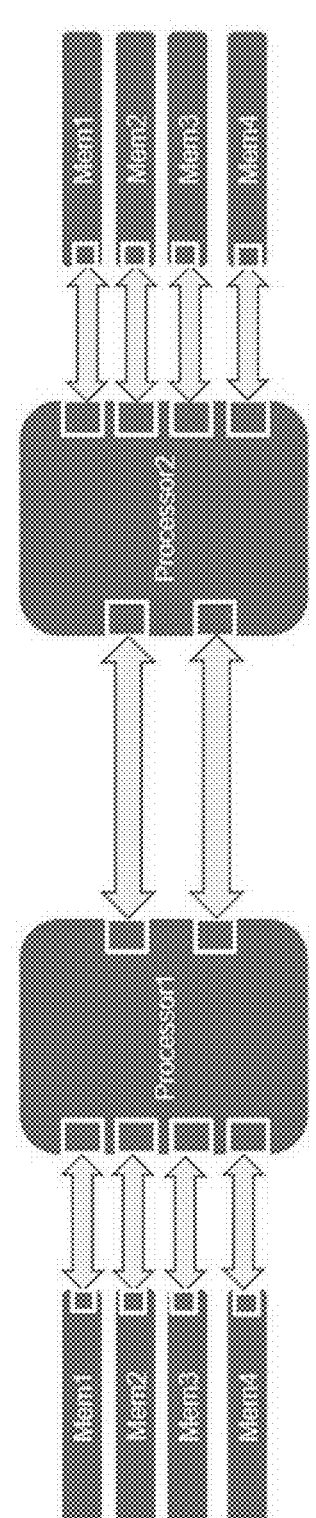
FIG. 18 is an illustration of an architecture diagram according to an embodiment of the present disclosure.

Referring now to FIG. 18, an embodiment of display process 10 including an architecture diagram 1800 is provided. In some embodiments, display process 10 may allow for interface signals visualization. Embodiments included herein may scale well for architecture diagram depicting interface signals visualization in system signal flow diagram. In some embodiments, display process 10 may be configured to display interface signals (e.g., a set of signals together), e.g. double data rate ("DDR"), peripheral component interconnect express ("PCIe") bus, etc. The process may allow for the display of interface signals as single entity, as interface pins shown as a single entity on both a source and a sink when complete interface is connected, as a different display characteristic for easy display identification, and/or split into sub-interfaces, as needed or per the connection on the source or sink side.

It will be apparent to those skilled in the art that various modifications and variations can be made in the current estimation scheme and debugging process of embodiments of the present disclosure without departing from the spirit or scope of the invention. Thus, it is intended that embodiments of the present disclosure cover the modifications and variations of this invention provided they come within the scope of the appended claims and their equivalents.

What is claimed is:

1. A computer-implemented method for use with an electronic design comprising:

receiving, using a processor, an electronic design;

applying one or more predefined rules to electronic design, including a device split rule that in response to receiving a plurality of input signals on a single device and determining that at least two of the received input signals originate from different input sources or different signal groups, is configured to designate at least one sub-device for each one of the input sources and to designate at least one sub-device for each one of the signal groups, such that each distinct input source or signal group corresponds to a separate output sub-device;

generating a connectivity aware system signal flow diagram; and causing a display of the connectivity aware system signal flow diagram at a graphical user interface, wherein the connectivity aware system signal flow diagram includes a visual representation and associated electrical connectivity information for simulation.

2. The computer-implemented method of claim 1, wherein the electronic design is an electronic design schematic.

3. The computer-implemented method of claim 1, wherein the electronic design is an electronic design layout.

4. The computer-implemented method of claim 1, wherein the one or more predefined rules includes an output signals grouping rule.

5. The computer-implemented method of claim 1, wherein the one or more predefined rules includes a signals split rule.

6. The computer-implemented method of claim 1, wherein the one or more predefined rules includes a signals merge rule.

7. The computer-implemented method of claim 1, wherein the one or more predefined rules includes a device grouping rule for input pins.

8. The computer-implemented method of claim 1, wherein the display is an expandable and collapsible tree structure.

9. The computer-implemented method of claim 8, wherein the expandable tree structure includes all source to sink signals placed and connected in order.

10. A non-transitory computer-readable storage medium stored thereon instructions, which when executed by a processor result in the following operations:

receiving, using a processor, an electronic design;

applying one or more predefined rules to electronic design, including a device split rule that in response to receiving a plurality of input signals on a single device and determining that at least two of the received input signals originate from different input sources or different signal groups, is configured to designate at least one sub-device for each one of the input sources and to designate at least one sub-device for each one of the signal groups, such that each distinct input source or signal group corresponds to a separate output sub-device;

automatically generating a connectivity aware system signal flow diagram; and causing a display of the connectivity aware system signal flow diagram at a graphical user interface, wherein the connectivity aware system signal flow diagram includes a visual representation and associated electrical connectivity information for simulation.

11. The computer-readable storage medium of claim 10, wherein the electronic design is an electronic design schematic.

12. The computer-readable storage medium of claim 10, wherein the electronic design is an electronic design layout.

13. The computer-readable storage medium of claim 10, wherein the one or more predefined rules includes an output signals grouping rule.

14. The computer-readable storage medium of claim 10, wherein the one or more predefined rules includes a signals split rule.

15. The computer-readable storage medium of claim 10, wherein the one or more predefined rules includes a signals merge rule.

16. The computer-readable storage medium of claim 10, wherein the one or more predefined rules includes a device grouping rule for input pins.

17. The computer-readable storage medium of claim 10, wherein the display is an expandable and collapsible tree structure.

18. A system comprising:

at least one processor to receive an electronic design and apply one or more predefined rules to electronic design, including a device split rule that in response to receiving a plurality of input signals on a single device and determining that at least two of the received input signals originate from different input sources or different signal groups, is configured to designate at least one sub-device for each one of the input sources and to designate at least one sub-device for each one of the signal groups, such that each distinct input source or signal group corresponds to a separate output sub-device, the at least one processor configured to automatically generate a connectivity aware system signal flow diagram and to cause a display of the connectivity aware system signal flow diagram at a graphical user interface, wherein the connectivity aware system signal flow diagram includes a visual representation and associated electrical connectivity information for simulation.

19. The system of claim 18, wherein the electronic design is an electronic design schematic.

20. The system of claim 18, wherein the electronic design is an electronic design layout.

21. The system of claim 18, wherein the one or more predefined rules includes an output signals grouping rule.

* * * * *